(12) United States Patent
Xie et al.

(10) Patent No.: US 9,136,858 B2
(45) Date of Patent: Sep. 15, 2015

(54) METHOD AND DEVICE FOR DIGITALIZING SCINTILLATION PULSE

(71) Applicant: RAYCAN TECHNOLOGY CO., LTD. (SUZHOU), Suzhou, Jiangsu (CN)

(72) Inventors: Qingguo Xie, Suzhou (CN); Daoming Xi, Suzhou (CN); Huihua Wen, Suzhou (CN); Xiang Liu, Suzhou (CN); Wei Liu, Suzhou (CN)

(73) Assignee: RAYCAN TECHNOLOGY CO., LTD. (SUZHOU), Suzhou New District, Suzhou, Jiangsu (CN)

( * ) Notice: Subject to any disclaimer, the term of this patent is extended or adjusted under 35 U.S.C. 154(b) by 0 days.

(21) Appl. No.: 14/412,393

(22) PCT Filed: Nov. 16, 2012

(86) PCT No.: PCT/CN2012/084719
§ 371 (c)(1),
(2) Date: Dec. 31, 2014

(87) PCT Pub. No.: WO2014/043989
PCT Pub. Date: Mar. 27, 2014

(65) Prior Publication Data
US 2015/0200680 A1 Jul. 16, 2015

(30) Foreign Application Priority Data

Sep. 20, 2012 (CN) .......................... 2012 1 0350796

(51) Int. Cl.
*H03M 1/50* (2006.01)
*H03M 1/12* (2006.01)
*G01T 1/208* (2006.01)
*G04F 10/00* (2006.01)

(52) U.S. Cl.
CPC ............. *H03M 1/1245* (2013.01); *G01T 1/208* (2013.01); *G04F 10/005* (2013.01)

(58) Field of Classification Search
CPC .......................... H03M 1/1245; G04F 10/005
USPC ............................... 341/166, 155, 144
See application file for complete search history.

(56) References Cited

U.S. PATENT DOCUMENTS

| 5,378,893 | A | 1/1995 | Murray et al. | |
|---|---|---|---|---|
| 6,325,076 | B1 * | 12/2001 | Ramirez | 132/309 |
| 8,222,607 | B2 * | 7/2012 | Mann | 250/362 |
| 2002/0009177 | A1 | 1/2002 | Takahashi | |

FOREIGN PATENT DOCUMENTS

CN         102262238 A     11/2011

OTHER PUBLICATIONS

Wang et al., IEEE Transactions on Nuclear Science, vol. 59, No. 3, p. 498-506, "Advantages of Digitally Sampling Scintillation Pulses iin Pileup Processing in PET", Jun. 2012.
Xie et al., IEEE Transactions on Nuclear Science, vol. 56, No. 5, p. 2607-2613, "Potentials of Digitally Sampling Scintillation Pulses in Timing Determination in PET", Oct. 2009.

* cited by examiner

*Primary Examiner* — Jean B Jeanglaude
(74) *Attorney, Agent, or Firm* — Knobbe Martens Olson & Bear LLP

(57) ABSTRACT

A method for digitalizing scintillation pulses includes: defining n threshold voltages V_th, forming a voltage comparison unit by n low-voltage differential signaling receiving ports, outputting, by the voltage comparison unit, a state-flip and a threshold voltage corresponding to the state-flip when one scintillation pulse to be sampled exceeds any one of the thresholds; and sampling digitally a time when the state-flip in step (2) occurs by a time-to-digit converter and identifying the threshold voltage corresponding to the state-flip, to acquire the voltage and the time for the scintillation pulse. The method can be performed using a device for digitalizing scintillation pulses.

17 Claims, 2 Drawing Sheets

--- n threshold voltages V_th are defined according to a characteristic of scintillation pulses, where n is an integer greater than 1 and less than 512

↓ a voltage comparison unit is formed by n low voltage differential signaling receiving ports; the voltage comparison unit may output a state-flip and a threshold voltage corresponding to the state-flip in the case that the pulse exceeds any one of the threshold voltages defined in step (1), where the low voltage differential signaling receiving port is configured to compare the scintillation pulses with the threshold voltages

↓ the time when the state-flip in step (2) occurs is digitally sampled by a time-to-digit converter and the threshold voltage corresponding to the state-flip is identified, to acquire the voltage and time for the scintillation pulse to implement the digitalization of the scintillation pulses n threshold voltages V_th are defined according to a characteristic of scintillation pulses, where n is an integer greater than 1 and less than 512

↓ a voltage comparison unit is formed by n low voltage differential signaling receiving ports; the voltage comparison unit may output a state-flip and a threshold voltage corresponding to the state-flip in the case that the pulse exceeds any one of the threshold voltages defined in step (1), where the low voltage differential signaling receiving port is configured to compare the scintillation pulses with the threshold voltages

↓ the time when the state-flip in step (2) occurs is digitally sampled by a time-to-digit converter and the threshold voltage corresponding to the state-flip is identified, to acquire the voltage and time for the scintillation pulse to implement the digitalization of the scintillation pulses

FIG. 1

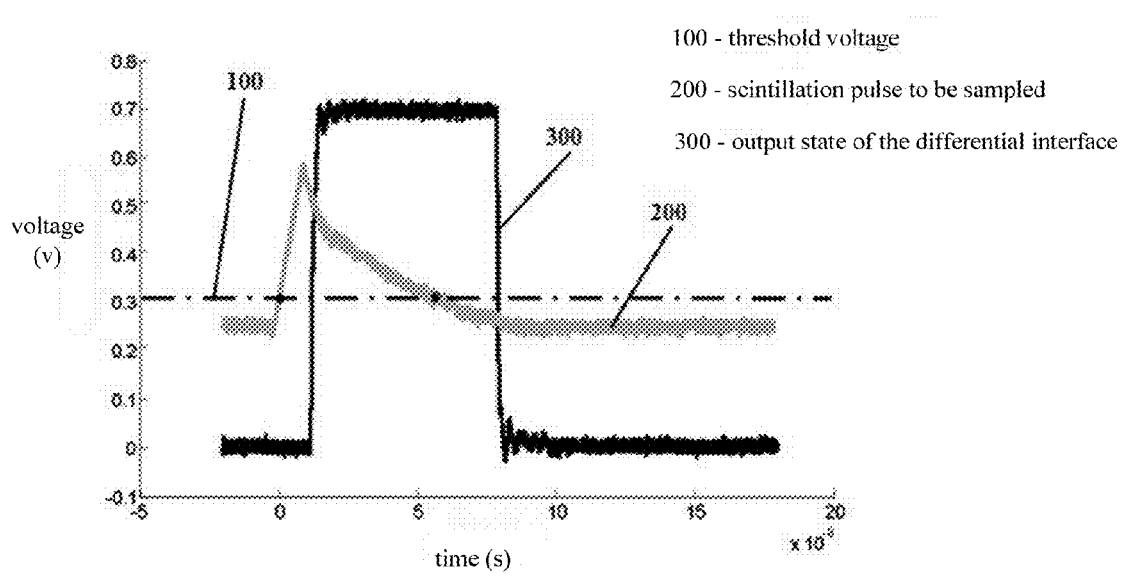

100 - threshold voltage
200 - scintillation pulse to be sampled
300 - output state of the differential interface

METHOD AND DEVICE FOR DIGITALIZING SCINTILLATION PULSE

This application is the US national phase of International Application No. PCT/CN2012/084719 field on Nov. 16, 2012, which claims priority to Chinese patent application No. 201210350796.4 titled "METHOD AND DEVICE FOR DIGITALIZING SCINTILLATION PULSE" and filed with the State Intellectual Property Office on Sep. 20, 2012 which are incorporated herein by reference in their entireties.

FIELD

The present disclosure generally relates to the field of apparatus for positron emission tomography, and in particular to a method for acquiring and processing scintillation pulses in an apparatus for positron emission tomography and a device thereof.

BACKGROUND

In Positron Emission Tomography (abbreviated as PET herein), the distribution of a tracer marked with positron nuclides is acquired by capturing gamma photons emitted due to annihilation of the positron in the human body, thereby pathophysiological features such as the function of an organ and metabolism are acquired. The imaging performance of the system is directly affected by the accuracy in acquiring energy, detected position and time information of gamma photons. A scintillation pulse sampling and processing unit is a crucial core component in a PET system with a main function to process the scintillation pulse sampled by a front-end detector and to obtain the energy, location and time information of gamma photons. It is desirable that the scintillation pulse sampling and processing unit has high accuracy, stable performance, convenience in real-time correction, high integrity and other character, to ensure the performance of the PET system.

The scintillation pulse sampling and processing unit in the conventional technology is generally a hybrid system mixed by an analog circuit and a digital circuit. The scintillation pulse information is mostly extracted by the analog circuit, and the digital circuit is mainly used to collect, store and transfer the corresponding information. The PET system using such scintillation pulse sampling and processing unit is difficult to implement real-time correction and thereby has critical demand for working environment.

The above problem can be solved by designing an all-digital PET system. To implement an all-digital PET system, total digitalization of the scintillation pulse sampling and processing unit may firstly be implemented. In designing and implementing of the totally digitalized scintillation pulse sampling and processing unit, a method and device for digitalizing scintillation pulses based on prior knowledge is proposed by Qingguo Xie et. al. (Xie, Q. and Kao, C. M. and Wang, X. and Guo, N. and Zhu, C. and Frisch, H. and Moses, W. W. and Chen, C. T., "Potentials of digitally sampling scintillation pulses in timing determination in PET", IEEE Transactions on Nuclear Science, vol. 56 pp. 2607-2613 2009). In this method, the time when a pulse exceeds a pre-defined threshold is acquired by using a threshold comparator and a time-digitalizing device to implement a sparse sampling on the scintillation pulse time axis. The scintillation pulse is rebuilt according to the acquired sampling data and a scintillation pulse module, and the information of the scintillation pulse is extracted based on the rebuilt scintillation pulse. The method provides a low cost solution for digitalizing the scintillation pulse. By increasing the number of thresholds, more sampling data may be acquired and the accuracy of rebuilding the pulse and extracting the corresponding information may be improved. However, it also means that more threshold comparators have to be employed in the system, resulting in significantly increasing system power consumption, lower system integration level and higher system cost.

Therefore, specific to the problems in current pulse sampling and processing technology, it is necessary to provide a new digitalized method and device for sampling and processing scintillation pulse, to overcome the disadvantages of the scintillation pulse sampling and processing unit in the conventional technology.

SUMMARY

In view of the above, the object of the present disclosure is to provide a method for digitalizing scintillation pulses and a device thereof without any comparator, which may increase the device integration level and reduce the system power consumption.

To implement the object described above, the following technical solution is provided in the present disclosure.

A method for digitalizing scintillation pulses includes:

step (1) including: defining n threshold voltages V_th according to a characteristic of the scintillation pulses, wherein n is an integer greater than 1 and less than 512;

step (2) including: forming a voltage comparison unit by n low-voltage differential signaling receiving ports, outputting, by the voltage comparison unit, a state-flip and a threshold voltage corresponding to the state-flip when one scintillation pulse to be sampled exceeds any one of the thresholds set in step (1); where the low-voltage differential signaling receiving ports are configured to compare the scintillation pulse with the threshold voltages;

step (3) including: sampling digitally a time when the state-flip in step (2) occurs by a time-to-digit converter and identifying the threshold voltage corresponding to the state-flip, to acquire the voltage and the time for the scintillation pulse to implement digitalization of the scintillation pulses.

Preferably, in the method for digitalizing scintillation pulses as described above, a standard for defining the threshold voltages V_th in step (1) is to determine a range for an amplitude of the scintillation pulses to be sampled, and select threshold voltages according to the amplitude of the scintillation pulses to be sampled to ensure that all the threshold voltages are within the range for the amplitude of the scintillation pulses to be sampled.

Preferably, in the method for digitalizing scintillation pulses as described above, a standard for defining the threshold voltage V_th in step (1) is to determine a range for an amplitude of the scintillation pulses to be sampled, and select threshold voltages according to the amplitude of the scintillation pulses to be sampled to ensure that at least one of the defined threshold voltages is within the range for the amplitude of the scintillation pulses to be sampled.

Preferably, in the method for digitalizing scintillation pulses as described above, the low-voltage differential signaling receiving port in step (2) may also be a positive emitter-coupled logic signal receiving port, an emitter-coupled logic signal receiving port, a current mode logic signal receiving port, a micro low-voltage differential signaling receiving port, a low-swing differential signaling receiving port or a bus type low-voltage differential signaling receiving port.

Preferably, in the method for digitalizing scintillation pulse as described above, the low-voltage differential signaling receiving port in step (2) may also be a digital signal receiving port which has a positive input terminal and a negative input terminal and determines a logic state of a signal based on a voltage difference between the positive input terminal and the negative input terminal Preferably, in the method for digitalizing scintillation pulses as described above, the voltage comparison unit in step (2) may also be formed by a voltage comparator.

Preferably, in the method for digitalizing scintillation pulse as described above, the forming the voltage comparison unit by the low-voltage differential signaling receiving ports in step (2) includes: the voltage comparison unit is formed by m low-voltage differential signaling receiving ports; the scintillation pulses to be sampled directly passes through a DC bias circuit without being divided to obtain a DC bias voltage V_bias, dividing the DC bias voltage into m portions; each portion of the DC bias voltage is connected to one terminal of the low-voltage differential signaling receiving port; and an other terminal of the low-voltage differential signaling receiving port is connected to a reference voltage V_reference; where m is an integer greater than 1 and less than 512, a relationship among the DC bias voltage V_bias, the reference voltage V_reference and the threshold voltage V_th is: V_reference=V_th+V_bias.

Preferably, in the method for digitalizing scintillation pulse as described above, the forming the voltage comparison unit by the low-voltage differential signaling receiving ports in step (2) includes: the voltage comparison unit is formed by m low-voltage differential signaling receiving ports; the scintillation pulse to be sampled are divided into m portions; each portion of the scintillation pulses passes through a DC bias circuit to obtain a DC bias voltage V_bias, the DC bias voltage is connected to one terminal of the low-voltage differential signaling receiving port; and an other terminal of the low-voltage differential signaling receiving port is connected to a reference voltage V_reference; where m is an integer greater than 1 and less than 512, a relationship among the DC bias voltage V_bias, the reference voltage V_reference and the threshold voltage V_th is: V_reference=V_th+V_bias.

Preferably, in the method for digitalizing scintillation pulse as described above, the forming the voltage comparison unit by the low-voltage differential signaling receiving ports in step (2) includes: the voltage comparison unit is formed by m low-voltage differential signaling receiving ports; the scintillation pulses to be sampled are divided into m portions, each portion of the scintillation pulses is connected to one terminal of the low-voltage differential signaling receiving port; and the other terminal of the low-voltage differential signaling receiving port is connected to a reference voltage V_reference; where m is an integer greater than 1 and less than 512, a relationship among the reference voltage V_reference and the threshold voltage V_th is: V_reference=V_th.

Preferably, in the method for digitalizing scintillation pulses as described above, the low-voltage differential signaling receiving port in step (2) is formed by configuring a programmable input/output pin supporting a digital differential signaling protocol in a field programmable gate array or is an application specific integrated chip.

A device for digitalizing scintillation pulses includes a scintillation pulse conversion unit, a threshold comparison unit, a time digitalizing unit and a data processing and transmission unit;

the scintillation pulse conversion unit is configured to output a DC bias voltage V_bias of the scintillation pulses, where the scintillation pulse conversion unit includes a DC bias circuit, after the scintillation pulse to be sampled passes through the DC bias circuit and m divided portions of a DC bias voltage V_bias are obtained, each portion of the DC bias voltage is connected to one terminal of a programmable input/output pin supporting a low-voltage differential signaling transmission protocol in a field programmable gate array, where m is an integer greater than 1 and less than 512;

the threshold comparison unit, configured to output a state-flip and a threshold voltage corresponding to the state-flip when the scintillation pulse exceeds any one of defined threshold voltages; wherein the threshold comparison unit is formed by m low-voltage differential signaling input terminals, the low-voltage differential signaling input terminal is configured to compare the scintillation pulses to be sampled with the threshold voltage V_th, and output the state-flip and the threshold voltage corresponding to the state-flip when an amplitude of the scintillation pulse to be sampled exceeds the threshold voltage;

the time digitalizing unit, configured to digitalize a time when the state-flip occurs, wherein the time digitalizing unit is implemented as p time-to-digit converters in a field programmable gate array, digitalizes the time when the state-flip occurs and identifies the threshold voltage corresponding to the state-flip, and acquires a time when the scintillation pulse to be sampled exceeds the threshold voltage, wherein p is an integer greater than 1 and less than 512; and the data processing and transmission unit, configured to integrate and transmit the voltage and the time for the scintillation pulse to be sampled acquired by the threshold comparison unit and the time digitalizing unit to implement digitalization of the scintillation pulses.

Preferably, in the device for digitalizing scintillation pulses as described above, the low-voltage differential signaling receiving port in the threshold comparison unit is formed by configuring the programmable input/output pin in the field programmable gate array, where the scintillation pulses to be sampled directly pass through a DC bias circuit without being divided to obtain a DC bias voltage V_bias, the DC bias voltage is divided into m portions, each portion of the DC bias voltage is connected to one terminal of the low-voltage differential signaling receiving port, the other terminal of the pin is connected to a reference voltage V_reference; wherein a relationship among the DC bias voltage V_bias, the reference voltage V_reference and the threshold voltage V_th is: V_reference=V_th+V_bias.

Preferably, in the device for digitalizing scintillation pulses as described above, the low-voltage differential signaling receiving port in the threshold comparison unit is formed by configuring the programmable input/output pin in a field programmable gate array, where the scintillation pulses to be sampled are divided into m portions, and each portion of the scintillation pulses passes through the DC bias circuit to obtain a DC bias voltage V_bias, the DC bias voltage is connected to one terminal of the low-voltage differential signaling receiving port, the other terminal of the pin is connected to a reference voltage V_reference; wherein a relationship among the DC bias voltage V_bias, reference voltage V_reference and threshold voltage V_th is: V_reference=V_th+V_bais.

Preferably, in the device for digitalizing scintillation pulsed as described above, the low-voltage differential signaling receiving port in the threshold comparison unit is formed by configuring the programmable input/output pin in a field programmable gate array, where the scintillation pulses to be sampled are divided into m portions, each portion of the scintillation pulses is connected to one terminal of the low-voltage differential signaling receiving port, and the other terminal of the pin is connected to a reference voltage V_reference; wherein a relationship between the reference voltage V_reference and the threshold voltage V_th is: V_reference=V_th.

Preferably, in the device for digitalizing scintillation pulses as described above, the low-voltage differential signaling receiving port in the threshold comparison unit may also be a positive emitter-coupled logic signal receiving port, an emitter-coupled logic signal receiving port, a current mode logic signal receiving port, a micro low-voltage differential signaling receiving port, a low-swing differential signaling receiving port or a bus type low-voltage differential signaling receiving port.

Preferably, in the device for digitalizing scintillation pulses as described above, the low-voltage differential signaling receiving port in the threshold comparison unit may also be a digital signal receiving port which has a positive input terminal and a negative input terminal and determines a logic state of a signal based on a voltage difference between the positive input terminal and the negative input terminal.

Preferably, in the device for digitalizing scintillation pulses as described above, the digital differential signaling receiving port used by a threshold comparison circuit in the threshold comparison unit is formed by an application specific integrated chip.

It can be seen from the technical solution described above that the threshold comparison is implemented by using the digital differential interface in the field programmable gate array according to the present disclosure, and a pair of voltage and time for the scintillation pulse is acquired, thereby the digitalization of the scintillation pulse is implemented, the system structure is significantly simplified, the system integration level is increased, and the system power consumption is lowered.

The advantageous effects of the present disclosure compared to the conventional technology are as follows.

(1) The usage of the comparator is avoided, the cost is lowered, the device integration level is increased and the system power consumption is lowered.

(2) The threshold comparison is implemented by using the digital differential interface in the field programmable gate array, and a pair of voltage and time for the scintillation pulse is acquired, thereby the digitalization of the scintillation pulse is implemented and the system structure is simplified.

BRIEF DESCRIPTION OF THE DRAWINGS

In order to more clearly illustrate the technical solutions of embodiments of the disclosure or the conventional technology, drawings used in the description of the embodiments or the conventional technology are described below simply. Obviously, the drawings in the following description are only a few embodiments of the disclosure. Other drawings may be obtained by those skilled in the art without any creative work based on the drawings provided herein.

FIG. 1 is a flowchart of a method for digitalizing scintillation pulses according to the present disclosure;

FIG. 2 is an actual test result of a threshold comparison implemented by employing a digital differential interface in a field programmable gate array in the method for digitalizing scintillation pulses according to the present disclosure.

DETAILED DESCRIPTION

Figure 3:
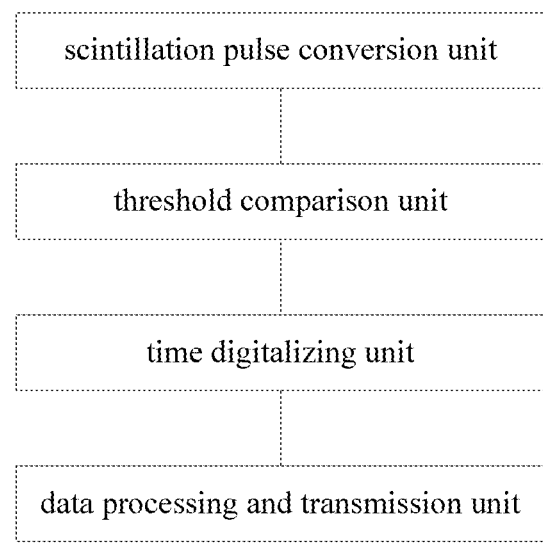
FIG. 3 is a block diagram of components of a device for digitalizing scintillation pulses according to the present disclosure.

The technical solutions of the embodiments of the present disclosure are described in detail below in conjunction with the drawings of the embodiments of the present disclosure. Obviously, the embodiments described are only a few of embodiments of the present disclosure. All the other embodiments obtained by those skilled in the art based on the embodiments of the present disclosure without creative work belong to the scope of the present disclosure.

As illustrated in FIG. 1, a method for digitalizing scintillation pulses disclosed according to the present disclosure includes the following steps.

(1) n threshold voltages V_th are defined according to a characteristic of scintillation pulses, where n is an integer greater than 1 and less than 512.

A standard for defining the threshold voltages V_th is to determine a range for an amplitude of the scintillation pulses to be sampled, and select threshold voltages based on the amplitude of the pulses to be sampled to ensure that all the threshold voltages are within the range of the amplitude of the scintillation pulses to be sampled.

The standard for defining the threshold voltages V_th may also be to determine a range for the amplitude of the scintillation pulses to be sampled, and select threshold voltages based on the amplitude of the pulses to be sampled to ensure that at least one of the set threshold voltages is within the range for the amplitude of the scintillation pulses to be sampled.

(2) A voltage comparison unit is formed by n low-voltage differential signaling receiving ports; the voltage comparison unit may output a state-flip and a threshold voltage corresponding to the state-flip in the case that the pulse exceeds any one of the threshold voltages defined in step (1); where the low-voltage differential signaling receiving port is configured to compare the scintillation pulse with the threshold voltages.

The low-voltage differential signaling receiving port may also be a positive emitter-coupled logic signal receiving port, an emitter-coupled logic signal receiving port, a current mode logic signal receiving port, a micro low-voltage differential signaling receiving port, a low-swing differential signaling receiving port or a bus type low-voltage differential signaling receiving port.

The low-voltage differential signaling receiving port may also be a digital signal receiving port which has a positive input terminal and a negative input terminal and determines a logic state of a signal based on a voltage difference these two input terminals.

The low-voltage differential signaling receiving port may also be formed by a voltage comparator.

The way for forming the voltage comparison unit by the low-voltage differential signaling receiving ports may include: the voltage comparison unit is formed by m low-voltage differential signaling receiving ports; a scintillation pulse to be sampled directly passes through a DC bias circuit without being divided to obtain a DC bias voltage V_bias; each portion of the signal is connected to one terminal of the low-voltage differential signaling receiving port; and an other terminal of the low-voltage differential signaling receiving port is connected to a reference voltage V_reference; where m is an integer greater than 1 and less than 512, a relationship among the DC bias voltage V_bias, the reference voltage V_reference and the threshold voltage V_th is: V_reference=V_th+V_bias.

The way for forming the voltage comparison unit by the low-voltage differential signaling receiving ports may also include: the voltage comparison unit is formed by m low-voltage differential signaling receiving ports; the scintillation pulses to be sampled are divided into m portions, then each portion of the pulse passes through a DC bias circuit to obtain a DC bias voltage V_bias, the DC bias voltage is connected to one terminal of the low-voltage differential signaling receiving port; and an other terminal of the low-voltage differential signaling receiving port is connected to a reference voltage V_reference; where m is an integer greater than 1 and less than 512, a relationship among the DC bias voltage V_bias, the reference voltage V_reference and the threshold voltage V_th is: V_reference=V_th+V_bias.

The way for forming the voltage comparison unit by the low-voltage differential signaling receiving ports may also include: the voltage comparison unit is formed by m low-voltage differential signaling receiving ports; the scintillation pulses to be sampled are divided into m portions, each portion of the pulses is connected to one terminal of the low-voltage differential signaling receiving port; and an other terminal of the low-voltage differential signaling receiving port is connected to a reference voltage V_reference; where m is an integer greater than 1 and less than 512, a relationship among the reference voltage V_reference and the threshold voltage V_th is: V_reference=V_th.

The low-voltage differential signaling receiving port may be formed by configuring a programmable input/output pin supporting a digital differential signal protocol in a field programmable gate array or an application specific integrated chip.

(3) The time when the state-flip in step (2) occurs is digitally sampled by a time-to-digit converter and the threshold voltage corresponding to the state-flip is identified, to acquire the voltage and the time for the scintillation pulses to implement the digitalization of the scintillation pulses.

There are large amount of differential input pins in a logic device such as a field programmable gate array. According to the present disclosure, the field programmable gate array differential pin's ability of comparing the voltage between the positive input terminal and the negative input terminal is utilized in the method for digitalizing the scintillation pulses. The scintillation pulses are input to the logic device such as the field programmable gate array via multiple digital differential input pins. A threshold comparator is implemented by using such pins. Then multiple threshold voltages are defined by using such threshold comparator according to the characteristic of the scintillation pulses. And the time when the scintillation pulses exceed the threshold may be acquired by a time-to-digit converter. Thereby, a pair of voltage and time for the scintillation pulses is acquired and the digitalization of the scintillation pulses is implemented. The system may be significantly simplified by employing the differential input pin to compare the threshold voltage, and therefore the system integration level is increased, and the system power consumption is reduced.

FIG. 2 illustrates an actual test result of the comparison with the threshold implemented by employing a digital differential interface in a field programmable gate array. As illustrated in FIG. 2, 100 represents a threshold voltage, 200 represents a scintillation pulse to be sampled, and 300 represents the output state of a differential interface.

As illustrated in FIG. 3, a device for digitalizing scintillation pulses is further provided according to the present disclosure and includes a scintillation pulse conversion unit, a threshold comparison unit, a time digitalizing unit and a data processing and transmission unit.

The scintillation pulse conversion unit is configured to output a DC bias voltage V_bias of the scintillation pulses, where the scintillation pulse conversion unit includes a DC bias circuit, the pulses to be sampled pass through the DC bias circuit to obtain m divided portions, each portion of the DC bias voltage is connected to one terminal of a programmable input/output pin supporting a low-voltage differential signaling transmission protocol in a field programmable gate array, where m is an integer greater than 1 and less than 512.

The threshold comparison unit is configured to output a state-flip and a threshold voltage corresponding to the state-flip when the scintillation pulses exceed any one of the defined threshold voltages; where the threshold comparison unit is formed by m low-voltage differential signaling input terminals, the low-voltage differential signaling input terminal is configured to compare the pulses with the threshold voltage V_th, and output a state-flip and a threshold voltage corresponding to the state-flip when the pulses exceed the threshold voltage.

The time digitalizing unit is configured to digitalize a time when the state-flip occurs, where the time digitalizing unit is implemented as p time-to-digit converters in a field programmable gate array, digitalizes the time when a state-flip occurs and identifies the threshold voltage corresponding to the state-flip, and acquires the time when the scintillation pulses to be sampled exceed the threshold voltage, where p is an integer greater than 1 and less than 512.

The data processing and transmission unit is configured to integrate and transmit a pair of voltage and time for the pulses to be sampled acquired by the threshold comparison unit and the time digitalizing unit to implement the digitalization of the scintillation pulses.

The low-voltage differential signaling receiving port in the threshold comparison unit may also be a positive emitter-coupled logic signal receiving port, an emitter-coupled logic signal receiving port or a current mode logic signal receiving port.

The low-voltage differential signaling receiving port in the threshold comparison unit may also be a digital signal receiving port which has a positive input terminal and a negative input terminal and determines a logic state of a signal based on a voltage difference between these two input terminals, a micro low-voltage differential signaling receiving port, a low-swing differential signaling receiving port or a bus type low-voltage differential signaling receiving port.

The digital differential signal receiving port used by a threshold comparison circuit in the threshold comparison unit is formed by an application specific integrated chip.

The low-voltage differential signaling receiving port in the threshold comparison unit is formed by configuring the programmable input/output pin in the field programmable gate array. There are three methods as follows to compare the pulse to be sampled with the threshold voltage by using the threshold comparison unit formed by the low-voltage differential signaling receiving port.

Method one: the pulses to be sampled directly passes through the DC bias circuit without being divided to obtain a DC bias voltage V_bias and then the DC bias voltage is divided into m portions, each portion of the DC bias voltage is connected to one terminal of the low-voltage differential signaling receiving port, an other terminal of the pin is connected to a reference voltage V_reference; where a relationship among the DC bias voltage V_bias, the reference voltage V_reference and the threshold voltage V_th is: V_reference=V_th+V_bias.

Method two: the pulses to be sampled are divided into m portions, each portion of the pulses passes through the DC bias circuit to obtain a DC bias voltage V_bias and then be connected to one terminal of the low-voltage differential signaling receiving port, an other terminal of the pin is connected to a reference voltage V_reference; where a relationship among the DC bias voltage V_bias, the reference voltage V_reference and the threshold voltage V_th is: V_reference=V_th+V_bias.

Method three: the pulses to be sampled are divided into m portions, each portion of the pulses is connected to one terminal of the low-voltage differential signaling receiving port, and an other terminal of the pin is connected to a reference voltage V_reference; where a relationship between the reference voltage V_reference and the threshold voltage V_th is: V_reference=V_th.

The time digitalizing unit and the data processing and transmission unit are both implemented in the field programmable gate array, and the time-to-digit converter in the time digitalizing unit is formed by a delay chain in the field programmable gate array. The digital differential signal receiving ports used by the threshold comparison circuit in the threshold comparison unit are formed by application specific integrated chips.

The disclosure is further illustrated in conjunction with an embodiment as follows.

(1) Four threshold voltages, i.e. 20 mV, 30 mV, 40 mV and 50 mV, are selected according to the characteristic of the scintillation pulse.

(2) The scintillation pulses are divided into four portions, each portion of the scintillation pulse passes through a discrete component and a DC bias voltage V_bais=1.25V is obtained. The four portions of the scintillation pulses, i.e. Ch1, Ch2, Ch3 and Ch4, which have the DC bias voltage respectively, are connected to positive input terminals of differential pins of a field programmable gate array respectively. The pins are configured as low-voltage differential signaling (referred to as LVDS) receiving ports.

(3) The amplitude of a reference voltage connected to the negative terminal of the differential pin is calculated based on the selected threshold voltage and the bias voltage used. The amplitudes in this embodiment are 1.27 mV, 1.28 mV, 1.29 mV and 1.30 mV respectively.

(4) The time-to-digit converter is implemented by using a carry chain in the field programmable gate array as a core. The time when the state-flip of each differential input pin occurs and the threshold voltage corresponding to the state-flip is identified, and a pair of the voltage and the time for the scintillation pulse is acquired.

(5) The acquired pair of voltage and time for the scintillation pulses is output via the digital interface of the field programmable gate array to implement the digitalization of scintillation pulses.

The threshold comparison is implemented by using the digital differential interface in the field programmable gate array according to the present disclosure, and the pair of voltage and time for the scintillation pulse is acquired, thereby the digitalization of the scintillation pulses is implemented, the system structure is significantly simplified, the system integration level is increased, and the system power consumption is lowered.

The advantageous effects of the present disclosure compared to the conventional technology are as follows.

(1) The usage of the comparator is avoided, thus the cost is limited, the device integration level is increased and the system power consumption is reduced.

(2) The threshold comparison is implemented by using the digital differential interface in the field programmable gate array, since the pair of voltage and time for the scintillation pulse is acquired, the digitalization of the scintillation pulse is implemented and the system structure is simplified.

It is apparent to those skilled in the art that the present disclosure is not limited to the details of the exemplary embodiments described above, and the present disclosure can be implemented in other specific form without departing from the spirit and the basic feature of the present disclosure. The embodiments therefore to be considered in all respects as illustrative and not restrictive. The scope of the present disclosure is defined by the appended claims rather than by the forgoing description, and all changes which come within the meaning and range of equivalency of the claims are therefore intended to be embraced therein. Any reference number in the claims should not be regarded as limitation to the claims.

Furthermore, it should be understood that although the specification is described by using embodiments, each embodiment does not only include one independent technical solution, the manner of the description in the specification is only for clarity, those skilled in the art should threat the specification as a whole, the technical solutions in the embodiments may also be appropriately combined to form other embodiments understandable by those skilled in the art.

What is claimed is:

1. A method for digitalizing scintillation pulses, comprising:

step (1) comprising: defining n threshold voltages V_th according to a characteristic of the scintillation pulses, wherein n is an integer greater than 1 and less than 512;

step (2) comprising: forming a voltage comparison unit by n low-voltage differential signaling receiving ports, outputting, by the voltage comparison unit, a state-flip and a threshold voltage corresponding to the state-flip when the scintillation pulse to be sampled exceeds any one of the thresholds set in step (1); wherein the low-voltage differential signaling receiving ports are configured to compare the scintillation pulses with the threshold voltages;

step (3) comprising: sampling digitally a time when the state-flip in step (2) occurs by a time-to-digit converter and identifying the threshold voltage corresponding to the state-flip, to acquire the voltage and the time for the scintillation pulse to implement digitalization of the scintillation pulses.

2. The method for digitalizing scintillation pulses according to claim 1, wherein a standard for defining the threshold voltages V_th in step (1) is to determine a range for an amplitude of the scintillation pulses to be sampled, and select threshold voltages according to the amplitude of the scintillation pulses to be sampled to ensure that all the threshold voltages are within the range for the amplitude of the scintillation pulses to be sampled.

3. The method for digitalizing scintillation pulses according to claim 1, wherein a standard for defining the threshold voltage V_th in step (1) is to determine a range for an amplitude of the scintillation pulses to be sampled, and select threshold voltages according to the amplitude of the scintillation pulses to be sampled to ensure that at least one of the defined threshold voltages is within the range for the amplitude of the scintillation pulses to be sampled.

4. The method for digitalizing scintillation pulses according to claim 1, wherein the low-voltage differential signaling receiving port in step (2) is a positive emitter-coupled logic signal receiving port, an emitter-coupled logic signal receiving port, a current mode logic signal receiving port, a micro low-voltage differential signaling receiving port, a low-swing differential signaling receiving port or a bus type low-voltage differential signaling receiving port.

5. The method for digitalizing scintillation pulses according to claim 1, wherein the low-voltage differential signaling receiving port in step (2) is a digital signal receiving port which has a positive input terminal and a negative input terminal and determines a logic state of a signal based on a voltage difference between the positive input terminal and the negative input terminal.

6. The method for digitalizing scintillation pulses according to claim 1, wherein the voltage comparison unit in step (2) is formed by a voltage comparator.

7. The method for digitalizing scintillation pulses according to claim 1, wherein the forming the voltage comparison unit by the low-voltage differential signaling receiving ports in step (2) comprises: the voltage comparison unit is formed by m low-voltage differential signaling receiving ports; the scintillation pulses to be sampled directly passes through a DC bias circuit without being divided to obtain a DC bias voltage V_bias, dividing the DC bias voltage into m portions; each portion of the DC bias voltage is connected to one terminal of the low-voltage differential signaling receiving port; and an other terminal of the low-voltage differential signaling receiving port is connected to a reference voltage V_reference; wherein m is an integer greater than 1 and less than 512, a relationship among the DC bias voltage V_bias, the reference voltage V_reference and the threshold voltage V_th is: V_reference=V_th+V_bias.

8. The method for digitalizing scintillation pulses according to claim 1, wherein the forming the voltage comparison unit by the low-voltage differential signaling receiving ports in step (2) comprises: the voltage comparison unit is formed by m low-voltage differential signaling receiving ports; the scintillation pulse to be sampled are divided into m portions; each portion of the scintillation pulses passes through a DC bias circuit to obtain a DC bias voltage V_bias, the DC bias voltage is connected to one terminal of the low-voltage differential signaling receiving port; and an other terminal of the low-voltage differential signaling receiving port is connected to a reference voltage V_reference; wherein m is an integer greater than 1 and less than 512, a relationship among the DC bias voltage V_bias, the reference voltage V_reference and the threshold voltage V_th is: V_reference=V_th+V_bias.

9. The method for digitalizing scintillation pulses according to claim 1, wherein the forming the voltage comparison unit by the low-voltage differential signaling receiving ports in step (2) comprises: the voltage comparison unit is formed by m low-voltage differential signaling receiving ports; the scintillation pulses to be sampled are divided into m portions, each portion of the scintillation pulses is connected to one terminal of the low-voltage differential signaling receiving port; and the other terminal of the low-voltage differential signaling receiving port is connected to a reference voltage V_reference; wherein m is an integer greater than 1 and less than 512, a relationship among the reference voltage V_reference and the threshold voltage V_th is: V_reference=V_th.

10. The method for digitalizing scintillation pulses according to claim 1, wherein the low-voltage differential signaling receiving port in step (2) is formed by configuring a programmable input/output pin supporting a digital differential signaling protocol in a field programmable gate array or is an application specific integrated chip.

11. A device for digitalizing scintillation pulses, comprising:
a scintillation pulse conversion unit, configured to output a DC bias voltage V_bias of the scintillation pulses, wherein the scintillation pulse conversion unit comprises a DC bias circuit, after the scintillation pulse to be sampled passes through the DC bias circuit and m divided portions of a DC bias voltage V_bias are obtained, each portion of the DC bias voltage is applied to one terminal of a programmable input/output pin supporting a low-voltage differential signaling transmission protocol in a field programmable gate array, wherein m is an integer greater than 1 and less than 512;
a threshold comparison unit, configured to output a state-flip and a threshold voltage corresponding to the state-flip when the scintillation pulse exceeds any one of defined threshold voltages; wherein the threshold comparison unit is formed by m low-voltage differential signaling input terminals, the low-voltage differential signaling input terminal is configured to compare the scintillation pulses to be sampled with a threshold voltage V_th, and output the state-flip and the threshold voltage corresponding to the state-flip when an amplitude of the scintillation pulse to be sampled exceeds the threshold voltage;
a time digitalizing unit, configured to digitalize a time when the state-flip occurs, wherein the time digitalizing unit is implemented as p time-to-digit converters in a field programmable gate array, digitalizes the time when the state-flip occurs and identifies the threshold voltage corresponding to the state-flip, and acquires a time when the scintillation pulse to be sampled exceeds the threshold voltage, wherein p is an integer greater than 1 and less than 512; and
a data processing and transmission unit, configured to integrate and transmit the voltage and the time for the scintillation pulse to be sampled acquired by the threshold comparison unit and the time digitalizing unit to implement digitalization of the scintillation pulses.

12. The device for digitalizing scintillation pulses according to claim 11, wherein the low-voltage differential signaling receiving port in the threshold comparison unit is formed by configuring the programmable input/output pin in a field programmable gate array, wherein the scintillation pulse to be sampled directly pass through a DC bias circuit without being divided to obtain a DC bias voltage V_bias, the DC bias voltage is divided into m portions, each portion of the DC bias voltage is connected to one terminal of the low-voltage differential signaling receiving port, the other terminal of the pin is connected to a reference voltage V_reference; wherein a relationship among the DC bias voltage V_bias, the reference voltage V_reference and the threshold voltage V_th is: V_reference=V_th+V_bias.

13. The device for digitalizing scintillation pulses according to claim 11, wherein the low-voltage differential signaling receiving port in the threshold comparison unit is formed by configuring the programmable input/output pin in a field programmable gate array, wherein the scintillation pulses to be sampled are divided into m portions, and each portion of the scintillation pulses passes through the DC bias circuit to obtain a DC bias voltage V_bias, the DC bias voltage is connected to one terminal of the low-voltage differential signaling receiving port, the other terminal of the pin is connected to a reference voltage V_reference;
wherein a relationship among the DC bias voltage V_bias, reference voltage V_reference and threshold voltage V_th is: V_reference=V_th+V_bais.

14. The device for digitalizing scintillation pulses according to claim 11, wherein the low-voltage differential signaling receiving port in the threshold comparison unit is formed by configuring the programmable input/output pin in a field programmable gate array, wherein the scintillation pulses to be sampled are divided into m portions, each portion of the scintillation pulses is connected to one terminal of the low-voltage differential signaling receiving port, and the other terminal of the pin is connected to a reference voltage V_reference; wherein a relationship between the reference voltage V_reference and the threshold voltage V_th is: V_reference=V_th.

15. The device for digitalizing scintillation pulses according to claim 11, wherein the low-voltage differential signaling receiving port in the threshold comparison unit is a positive emitter-coupled logic signal receiving port, an emitter-coupled logic signal receiving port, a current mode logic signal receiving port, a micro low-voltage differential signaling receiving port, a low-swing differential signaling receiving port or a bus type low-voltage differential signaling receiving port.

16. The device for digitalizing scintillation pulses according to claim 11, wherein the low-voltage differential signaling receiving port in the threshold comparison unit is a digital signal receiving port which has a positive input terminal and a negative input terminal and determines a logic state of a signal based on a voltage difference between the positive input terminal and the negative input terminal.

17. The device for digitalizing scintillation pulses according to claim 11, wherein the digital differential signaling receiving port used by a threshold comparison circuit in the threshold comparison unit is formed by an application specific integrated chip.

\* \* \* \* \*